United States Patent [19]

Saeki

[11] Patent Number: 5,243,558
[45] Date of Patent: Sep. 7, 1993

[54] DYNAMIC RANDOM ACCESS MEMORY DEVICE WITH BIT LINES PARTIALLY SHARED BETWEEN SENSE AMPLIFIER CIRCUITS

[75] Inventor: Takanori Saeki, Tokyo, Japan
[73] Assignee: NEC Corporation, Tokyo, Japan
[21] Appl. No.: 841,067
[22] Filed: Feb. 25, 1992
[30] Foreign Application Priority Data
Feb. 27, 1991 [JP] Japan .................................. 3-32840
[51] Int. Cl.$^5$ .............................................. G11C 5/06
[52] U.S. Cl. .................................... 365/182; 365/63; 365/189.01; 365/206
[58] Field of Search .............. 365/182, 189.01, 230.01, 365/205, 207, 63, 206, 149

[56] References Cited

U.S. PATENT DOCUMENTS

| | | | |
|---|---|---|---|
| 5,091,887 | 2/1992 | Asakura | 365/63 |
| 5,097,441 | 3/1992 | Cho et al. | 365/63 |
| 5,107,459 | 4/1992 | Cho et al. | 365/63 |
| 5,155,700 | 10/1992 | Min et al. | 365/63 |

FOREIGN PATENT DOCUMENTS 63-205897  8/1988  Japan .................................. 365/205

Primary Examiner—Eugene R. LaRoche
Assistant Examiner—Tan Nguyen
Attorney, Agent, or Firm—Sughrue, Mion, Zinn, Macpeak & Seas

[57] ABSTRACT

A dynamic random access memory device in the folded bit line configuration comprises first sense amplifier circuits located on one side of sets of bit lines associated with first transfer units, second sense amplifier circuits located on the other side of the sets of bit lines asoicated with second transfer units, and sets of word lines, and each sets of bit lines and each set of word lines respectively consist of first to third bit lines and first to third word lines for providing nine addressable locations, wherein memory cells are provided at six addressable locations selected from the nine addressable locations, and each set of bit lines respectively propagate two data bits read out from two of the six memory cells to the first and second sense amplifier circuits, thereby increasing the number of memory cells in a unit area.

6 Claims, 3 Drawing Sheets

DYNAMIC RANDOM ACCESS MEMORY DEVICE WITH BIT LINES PARTIALLY SHARED BETWEEN SENSE AMPLIFIER CIRCUITS

FIELD OF THE INVENTION

This invention relates to a dynamic random access memory device and, more particularly, to arrangement of bit lines coupled between a memory cell array and sense amplifier circuits.

DESCRIPTION OF THE RELATED ART

In the dynamic random access memory device, data bits are stored in the memory cells in the form of electric charges, and the data bits read out therefrom produces differential voltage levels on the associated bit line pairs. The bit line pairs propagate the differential voltage levels to sense amplifier circuits, and the sense amplifier circuits rapidly develop the differential voltage levels for high speed read-out operation.

Various bit line arrangements have been proposed, and are roughly broken down into two categories. The first category is known as "open bit line configuration", and is illustrated in FIG. 1. The dynamic random access memory device has two memory cell arrays 1a and 1b, and two sets of bit lines 2a/ 2b/ 2c and 3a/ 3b/ 3c are respectively provided for the two memory cell arrays 1a and 1b. The memory cell array 1a is implemented by a large number of memory cells arranged in rows and columns, and small bubbles respectively stand for the memory cells in the matrix. The first set of bit lines 2a to 2c are associated with the memory cell array 1a. Similarly, the other memory cell array 1b comprises a large number of memory cells each indicated by a small bubble, and are associated with the other set of bit lines 3a to 3c. Though not shown in the drawings, each of the memory cells is implemented by a series combination of a transfer transistors and a storage capacitor. Two sets of word lines 4a/ 4b/ 4c/ 4d and 5a/ 5b/ 5c/ 5d are further associated with the two memory cell arrays 1a and 1b, respectively. The word lines 4a to 4d and the bit lines 2a to 2c define addresses at respective crossing points, and the addresses are assigned to the memory cells of the array 1a. Similarly, the word lines 5a to 5d and the bit lines 3a to 3c define addresses assigned to the memory cells of the array 1b. An array of sense amplifier circuits 6a, 6b and 6c are located between the memory cell arrays 1a and 1b, and the bit lines 2a to 2c are respectively paired with the bit lines 3a to 3c so as to form bit line pairs. The bit line pairs are coupled with the sense amplifier circuits 6a to 6c, and the bit line pairs propagate data bits read out from either memory cell array 1a or 1b to the sense amplifier circuits 6a to 6c. The dynamic random access memory device in the open bit line configuration is preferable in view of integration density, because all of the crossing points are assignable to the addressable memory cells. However, the bit lines paired with each other are associated with the memory cell arrays 1a and 1b, respectively, and anti-phase noise tends to ride on the bit line pair. The anti-phase noise decreases the differential voltage level propagated therein, and, accordingly, causes the associated sense amplifier circuit to be less sensitive.

The second category is sometimes referred as "folded bit line configuration", and FIG. 2 shows a typical example of the dynamic random access memory device in the folded bit line configuration. All of the memory cells each indicated by a small bubble form in combination a single memory cell array 11, and each of the memory cells is implemented by a series combination of a transfer transistor and a storage capacitor. Bit lines 12a and 12b are respectively paired with bit lines 13a and 13b, and the bit lines 12a to 12b and 13a to 13b form bit line pairs associated with the memory cell array 11. An array of sense amplifier circuits 14a and 14b are provided on one of the sides of the memory cell array 11, and the bit line pairs are respectively coupled with the sense amplifier circuits 14a and 14b. Word lines 15a, 15b, 15c, 15d, 15e and 15f are further provided for the memory cell array 11, and the memory cells are located at half of the crossing points between the word lines 15a to 15f and the bit lines 12a, 13a, 12b and 13b, because either bit line 12a or 13a of each bit line pair can be coupled with the storage capacitor for producing small differential voltage level. For this reason, the dynamic random access memory device in the folded bit line configuration is less desirable in view of integration density. However, since not only the bit lines 12a and 12b but also the bit lines 13a and 13b pass over the area assigned to the memory cell array 11, noise has the same influence on the bit lines 12a/ 12b and 13a/ 13b, and the in-phase noise less degrades the sensitivity of the associated sense amplifier circuits 14a and 14b.

FIG. 3 shows another prior art dynamic random access memory device in the folded bit line configuration, and the component lines and circuits are labeled with references used for the corresponding lines and circuits in FIG. 2. The bit lines 12a and 12b are interdigitated with the bit lines 13a and 13b, and, accordingly, the sense amplifier circuits 14a and 14b are located on both sides of the memory cell array 11. Even if the gaps between the bit lines 12a to 13b are decreased, a large amount of real estate is assigned to each of the sense amplifier circuits 14a and 14b, and the large amount of real estate allows each sense amplifier circuit to maintain the sensitivity high. However, only half of the crossing points can be assigned to the memory cells, and the prior art dynamic random access memory device also encounters a problem inherent in the prior art dynamic random access memory device.

SUMMARY OF THE INVENTION

It is therefore an important object of the present invention to provide a dynamic random access memory device which is improved in integration density without sacrifice of sensitivity of sense amplifier circuits against noise.

To accomplish the object, the present invention proposes to share a bit line between two sense amplifier circuits for providing a reference voltage level.

In accordance with the present invention, there is provided a dynamic random access memory device fabricated on a single semiconductor chip, comprises: a) a memory cell array implemented by a plurality of memory cells respectively storing data bits; b) a plurality of sets of bit lines associated with the memory cell array, and each of the sets of bit lines having first second and third bit lines; c) a plurality of word lines providing a plurality of addressable locations at virtual crossing points together with the first, second and third bit lines of the sets of bit lines, the plurality of memory cells being selectively assigned to the plurality of addressable locations, one of the plurality of word lines allowing two of the first, second and third bit lines of each set to propagate two data bits read out from the memory cell array; d) first sense amplifier circuits provided on one side of the sets of bit lines, and respectively associated with the sets of bit lines; e) first transfer gate units respectively coupled between the sets of bit lines and the first sense amplifier circuits; f) second sense amplifier circuits provided on the other side of the sets of bit lines, and respectively associated with the sets of bit lines; g) second transfer gate units respectively coupled between the sets of bit lines and the second sense amplifier circuits; and h) a controlling unit operative to control the first and second transfer gate units in such a manner that one of the first, second and third bit lines of each set supplies a reference voltage level to the associated first and second sense amplifier circuits for discriminating logic levels of the two data bits read out from memory cells selected by one of the word lines to the others of the first, second and third bit lines in the form of voltage level.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENT

Figure 1:
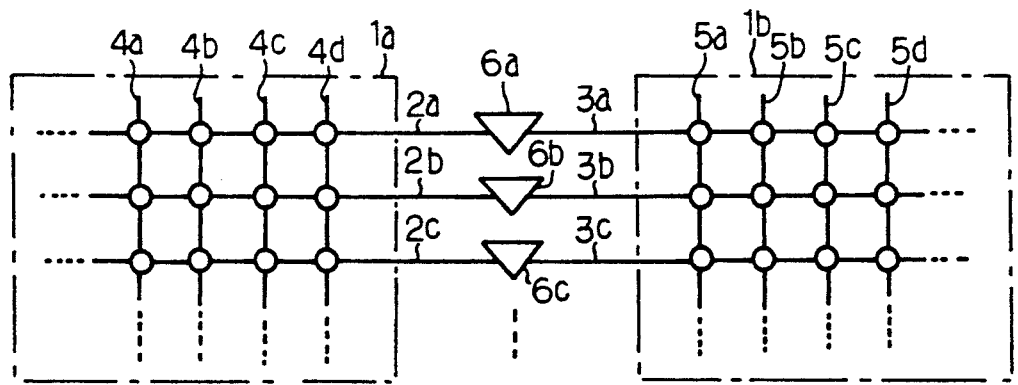
FIG. 1 is a block diagram showing the arrangement of the prior art dynamic random access memory device in the open bit line configuration.
Figure 2:
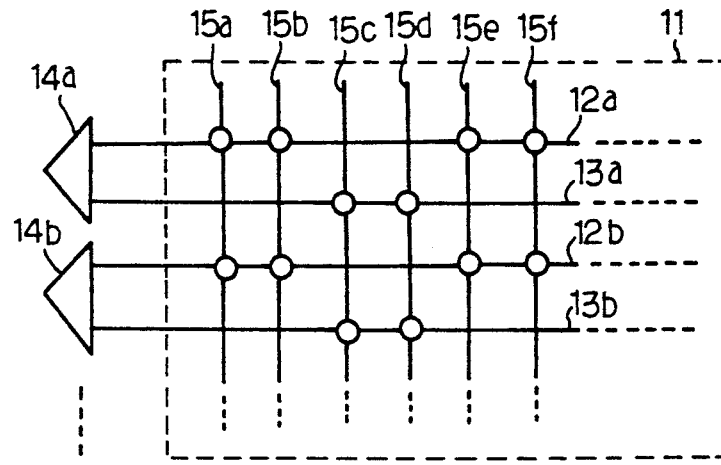
FIG. 2 is a block diagram showing the arrangement of another prior art dynamic random access memory device in the folded bit line configuration.
Figure 3:
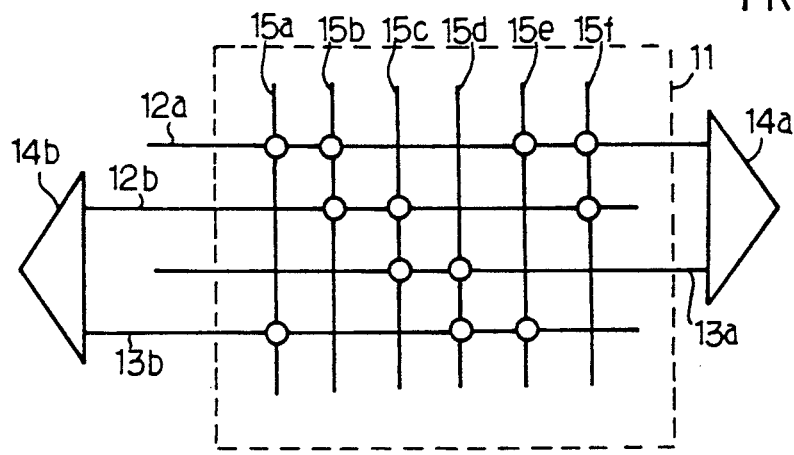
FIG. 3 is a block diagram showing the arrangement of yet another prior art dynamic random access memory device in the folded bit line configuration.
Figure 4:
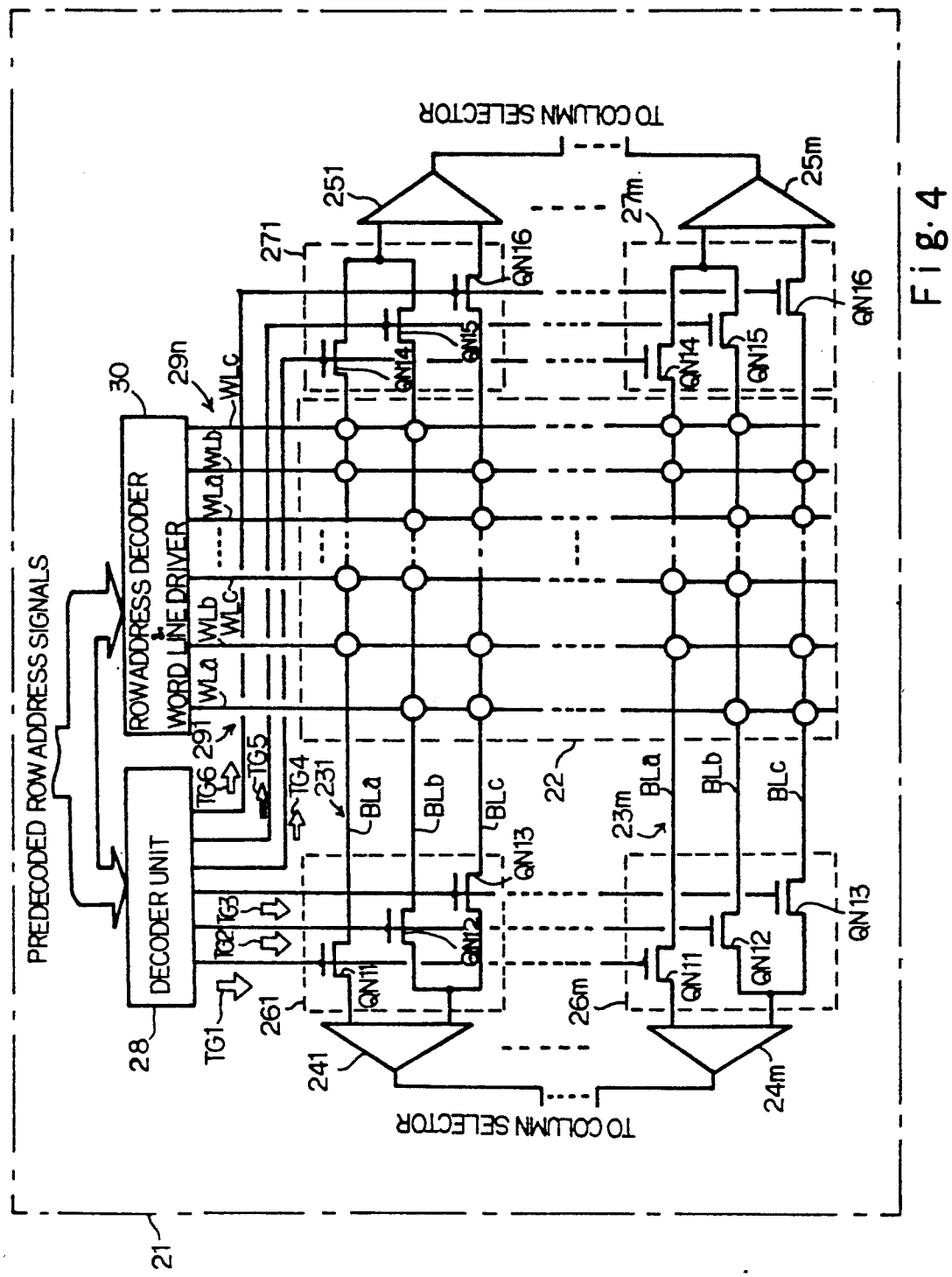
FIG. 4 is a block diagram showing the arrangement of a dynamic random access memory device according to the present invention.

Referring first to FIG. 4 of the drawings, a dynamic random access memory device embodying the present invention is fabricated on a signal semiconductor chip 21, and comprises a memory cell array 22 implemented by a large number of memory cells each indicated by a small bubble. Though not shown in the drawings, each of the memory cells is implemented by a series combination of a transfer transistor and a storage capacitor. Sets of bit lines 231 to 23m are associated with the memory cell array 22, and first sense amplifier circuits 241 to 24m are provided on one side of the sets of bit lines 231 to 23m. Second sense amplifier circuits 251 to 25m are further provided on the other side of the sets of bit lines 231 to 23m, and an array of first transfer gate units 261 to 26m are coupled between the sets of bit lines 231 to 23m and the first sense amplifier circuits 241 to 24m. An array of second transfer gate units 271 to 27m are coupled between the sets of bit lines 231 to 23m and the second sense amplifier circuits 251 to 25m, and the first and second transfer units 261 to 26m and 271 to 27m are controlled by a decoder unit 28. The memory cell array 22 is further associated with sets of word lines 291 to 29n, and the sets of word lines 291 to 29n are selectively driven by a row address decoder/ word line driver unit 30.

Each of the sets of bit lines 231 to 23m consists of first, second and third bit lines BLa, BLb and BLc, and each of the sets of word lines 291 to 29n has first, second and third word lines WLa, WLb and WLc. Each set of bit lines and each set of word lines define nine addressable locations, and two third, i.e., six addressable locations are assigned to six memory cells. Therefore, a unit area is occupied by memory cells one and half times as large as those of the prior art dynamic random access memory device in the folded bit line configuration.

Each of the first transfer units 261 to 26m is implemented by three n-channel enhancement type transfer transistors QN11, QN12 and QN13 respectively coupled with the first to third bit lines BLa, BLb and BLc of the associated set of bit lines, and the n-channel enhancement type transfer transistor QN11 is directly coupled with one of the input nodes of the associated first sense amplifier circuit. However, the other input node of the associated first sense amplifier circuit is shared between the other n-channel enhancement type transfer transistors QN12 and QN13. Each of the second transfer units 271 to 27m is implemented by three n-channel enhancement type transfer transistors QN14, QN15 and QN16 respectively coupled with the first to third bit lines BLa, BLb and BLc of the associated set of bit lines, and the n-channel enhancement type transfer transistors QN14 and QN15 are commonly coupled with one of the input nodes of the associated first sense amplifier circuit. However, the other input node of the associated first sense amplifier circuit is coupled with the other n-channel enhancement type transfer transistor QN16. Although other component units such as, for example, a precharging unit, a column selector unit and a column address decoder unit are further incorporated in the dynamic random access memory device, because these component units are less important to understand the present invention.

Using the first and second transfer units 261 to 26m and 271 to 27m, the storage capacitors of two memory cells are coupled with two of the first to third bit lines BLa, BLb and BLc, and the remaining bit line BLa, BLb or BLc is shared between the associated two sense amplifier circuits. In order to appropriately couple the first, second and third bit lines BLa, BLb and BLc with the associated sense amplifier circuits, the decoder unit 28 produces first to sixth transfer signals TG1, TG2, TG3, TG4, TG5 and TG6, and the n-channel enhancement type transfer transistors QN11 to QN16 are selectively gated by the first to sixth transfer signals TG1 to TG6.

Figure 5:
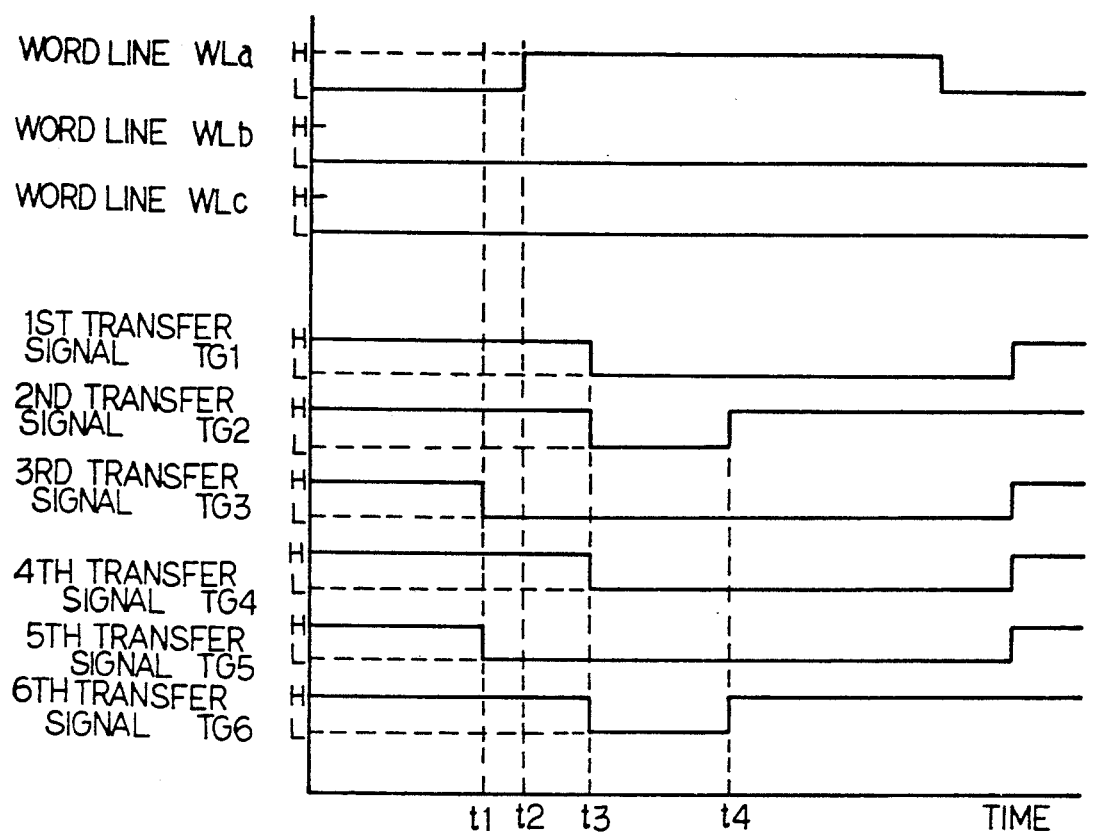
FIG. 5 is a timing chart showing a sequence of a read-out mode of operation on one of the sets of bit lines incorporated in the dynamic random access memory device.

Description is hereinbelow made on circuit behavior of the dynamic random access memory device with reference to FIG. 5 on the assumption that the word line WLa of the set of word lines 291 is selected by row address bits. Before time t1, all of the word lines WLa to WLc remain in an inactive low voltage level L, and all of the transfer signals TG1 to TG6 have been lifted to an active high voltage level H. The precharging unit (not shown) supplies current to all of the bit lines BLa, BLb and BLc, and all of the bit lines BLa to BLc and the input nodes of the first and second sense amplifier circuits 241 to 24m and 251 to 25m are charged and balanced at an intermediate voltage level between high and low voltage levels H and L.

At time t1, the third and fifth transfer signals TG3 and TG5 are decayed to the low voltage level, and the n-channel enhancement type transfer transistors QN13 and QN15 turn off to cut the first and second sense amplifier circuits 241 to 24m and 251 to 25m from the bit lines BLc and BLb, respectively. In other words, the first sense amplifier circuits 241 to 24m are coupled at the input nodes thereof with the first and second bit lines BLa and BLb, and the second sense amplifier circuits 251 to 25m are coupled at the input nodes thereof with the first and third bit lines BLa and BLc.

The row address decoder/ word line driver unit 30 drives the word line WLa of the set of word lines 291 to the active high voltage level H at time t2, and data bits are read out from the memory cells to the second and third bit lines BLb and BLc. Since the data bits are stored in the form of electric charges, the voltage levels on the second and third bit lines BLb and BLc are varied from the intermediate voltage level. However, the first bit lines BLa remains in the intermediate voltage level, and the intermediate voltage level serves as a reference voltage level for discriminating logic levels of the data bits read out to the second and third bit lines BLb and BLc.

As described hereinbefore, the n-channel enhancement type transfer transistors QN11, QN12, QN14 and QN16 are turned on, and the voltage levels on the first and second bit lines BLa and BLb are transferred to the first sense amplifier circuits 241 to 24m. Similarly, the voltage levels on the first and third bit lines BLa and BLc are transferred to the second sense amplifier circuits 251 to 25m. In other words, the data bits each indicated by the small differential voltage between the first and second bit lines BLa and BLb are relayed to the first sense amplifier circuits 241 to 24m, and the data bits each indicated by the small differential voltage between the first and third bit lines BLa and BLc are supplied to the second sense amplifier circuits 251 to 25m.

The first, second, fourth and sixth transfer signals TG1, TG2, TG4 and TG6 are decayed to the low voltage level L at time t3, and the first and second sense amplifier circuits 241 to 24m and 251 to 25m develop the respective small difference voltage levels at the input nodes thereof for quickly discriminating the logic levels. The data bits thus discriminated are supplied from the first and second sense amplifier circuits 241 to 24m and 251 to 25m to a column selector unit (not shown), and are selectively delivered to the outside thereof in response to column address bits.

The second and sixth transfer signals TG2 and TG6 are lifted to the high voltage level at time t4, and the developed voltage levels indicative of the data bits are restored in the selected memory cells.

Thus, the first to sixth transfer signals TG1 to TG6 cause one of the first to third bit lines BLa to BLc to serve as a reference voltage propagating line, and Table shows relation between the first and second sense amplifier circuits and the bit lines coupled thereto in terms of selected word line.

TABLE

| Selected Word Line | 1st Sense Amp. | 2nd Sense Amp. |
|---|---|---|
| WLa | Bit Lines BLa $ BLb | Bit Lines BLa $ BLc |
| WLb | Bit Lines BLa $ BLb | Bit Lines BLb $ BLc |
| WLc | Bit Lines BLa $ BLc | Bit Lines BLb $ BLc |

Although particular embodiments of the present invention have been shown and described, it will be obvious to those skilled in the art that various changes and modifications may be made without departing from the spirit and scope of the present invention. For example, more than one memory cell array may be incorporated in a dynamic random access memory device with arrangement of bit lines according to the present invention.

What is claimed is:

1. A dynamic random access memory device fabricated on a single semiconductor chip, comprises:
  a) a memory cell array implemented by a plurality of memory cells respectively storing data bits;
  b) a plurality of sets of bit lines associated with said memory cell array, and each of said sets of bit lines having first, second and third bit lines;
  c) a plurality of word lines providing a plurality of addressable locations at virtual crossing points together with said first, second and third bit lines of said sets of bit lines, said plurality of memory cells being selectively assigned to said plurality of addressable locations, one of said plurality of word lines allowing two of said first, second and third bit lines of each set to propagate two data bits read out from said memory cell array;
  d) first sense amplifier circuits provided on one side of said sets of bit lines, and respectively associated with said sets of bit lines;
  e) first transfer gate units respectively coupled between said sets of bit lines and said first sense amplifier circuits;
  f) second sense amplifier circuits provided on the other side of said sets of bit lines, and respectively associated with said sets of bit lines;
  g) second transfer gate units respectively coupled between said sets of bit lines and said second sense amplifier circuits; and
  h) a controlling unit operative to control said first and second transfer gate units in such a manner that one of said first, second and third bit lines of each set supplies a reference voltage level to the associated first and second sense amplifier circuits for discriminating logic levels of said two data bits read out from memory cells selected by one of said word lines to the others of said first, second and third bit lines in the form of voltage level.

2. A dynamic random access memory device as set forth in claim 1, in which said plurality of word lines are broken down into sets of word lines each having first, second and third word lines, said first, second and third bit lines of each set of bit lines and said first, second and third word lines of each set of word lines providing nine virtual crossing points, six virtual crossing points selected from said nine virtual crossing points being occupied by memory cells of said memory cell array.

3. A dynamic random access memory device as set forth in claim 2, in which virtual crossing points of said first word line and said second and third bit lines, virtual crossing points of said second word line and said first and third bit lines and virtual crossing points of said third word line and said first and second bit lines are occupied by said six memory cells of said memory cell array.

4. A dynamic random access memory device as set forth in claim 3, in which each of said first transfer gate units is implemented by first, second and third transfer transistors, said first transfer transistor being coupled with one of two input nodes of the associated first sense amplifier circuit, said second and third transfer transistors being commonly coupled with the other input node of said associated first sense amplifier circuit.

5. A dynamic random access memory device as set forth in claim 4, in which each of said second transfer gate units is implemented by fourth, fifth and sixth transfer transistors, said fourth and fifth transfer transistors being commonly coupled with one of two input nodes of the associated second sense amplifier circuit, said sixth transfer transistor being coupled with the other input node of said associated second sense amplifier circuit.

6. A dynamic random access memory device as set forth in claim 5, in which said controlling unit is coupled through first, second, third, fourth, fifth and sixth control signal lines respectively coupled with gate electrodes of said first to sixth transfer transistors, said first to sixth control signal lines allowing said first bit line to be shared between the associated first and second sense amplifier circuits for supplying said reference voltage level when said first word line is selected.

* * * * *